(12) United States Patent
Broude et al.

(10) Patent No.: US 7,210,820 B2
(45) Date of Patent: May 1, 2007

(54) METHODS AND APPARATUSES FOR HOMOGENIZING LIGHT

(75) Inventors: Sergey V. Broude, Newton Centre, MA (US); David S. Holbrook, Lexington, MA (US); Pascal Miller, North Chelmsford, MA (US)

(73) Assignee: Resonetics, Inc., Nashua, NH (US)

( * ) Notice: Subject to any disclaimer, the term of this patent is extended or adjusted under 35 U.S.C. 154(b) by 209 days.

(21) Appl. No.: 10/839,026

(22) Filed: May 4, 2004

(65) Prior Publication Data

US 2004/0223330 A1  Nov. 11, 2004

Related U.S. Application Data

(60) Provisional application No. 60/468,511, filed on May 7, 2003.

(51) Int. Cl.
*F21S 8/00* (2006.01)
(52) U.S. Cl. ............ 362/268; 362/259; 362/553; 359/619; 359/622; 219/121.73
(58) Field of Classification Search .......... 362/259, 362/268, 551, 553; 219/121.73, 121.71; 359/619, 723, 622, 626
See application file for complete search history.

(56) References Cited

U.S. PATENT DOCUMENTS

| 4,744,615 | A |   | 5/1988  | Wilczynski et al. | ....... 350/96.1 |
|-----------|---|---|---------|-------------------|------------------|
| 4,918,583 | A |   | 4/1990  | Kudo et al.       | .......... 362/268 |
| 5,109,465 | A |   | 4/1992  | Klopotek          | .......... 385/133 |
| 5,721,416 | A |   | 2/1998  | Burghardt et al.  | ..... 219/121.73 |
| 5,946,138 | A | * | 8/1999  | Mizouchi          | .......... 362/259 |
| 6,002,101 | A | * | 12/1999 | Yamazaki et al.   | .......... 359/622 |

FOREIGN PATENT DOCUMENTS

EP  1 055 479 A2  11/2000

OTHER PUBLICATIONS

International Search Report dated Jun. 10, 2004 for PCT/US04/014239.

* cited by examiner

*Primary Examiner*—Stephen F Husar
(74) *Attorney, Agent, or Firm*—Mintz, Levin, Cohn, Ferris, Glovsky and Popeo, P.C.

(57) ABSTRACT

Embodiments of the present invention are directed to an illuminating optical device for forming a field of illumination. The optical device includes a first one-dimensional homogenizer positioned to homogenize a first dimension/axis of the field of illumination and a second one-dimensional homogenizer positioned to homogenize a second dimension/axis of the field of illumination.

15 Claims, 8 Drawing Sheets

| Lens Array | Resulting beam (Superposition) | Aspect ratio | Number of elements |
|---|---|---|---|
| 6x6  | | 1:1 | 36 Lenses |

| | | | |
|---|---|---|---|
| 6x12  | | 2:1 | 72 Lenses |

| | | | |
|---|---|---|---|
| 6x60  | | 10:1 | 360 Lenses |

| | | | |
|---|---|---|---|
| 6x600  | | 100:1 | 3600 Lenses |

34.3 cm, 1 mm 68.6 cm, 2 mm 343 cm, 10 mm

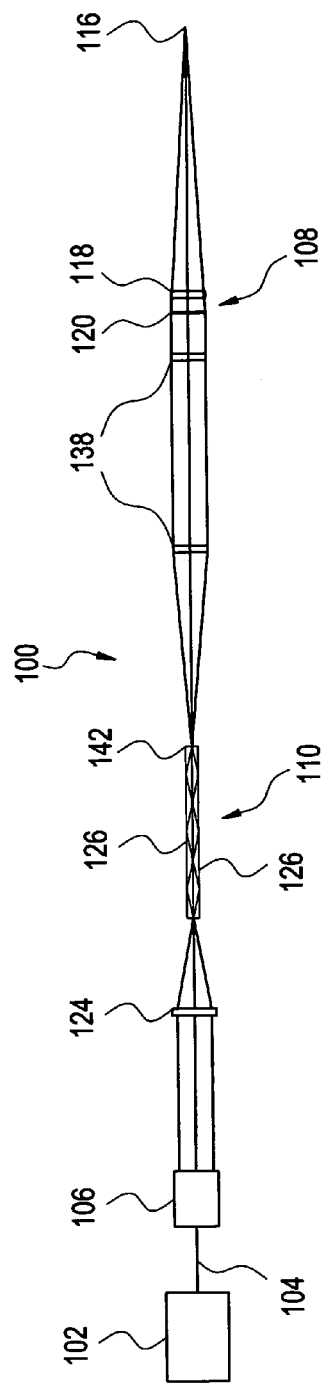
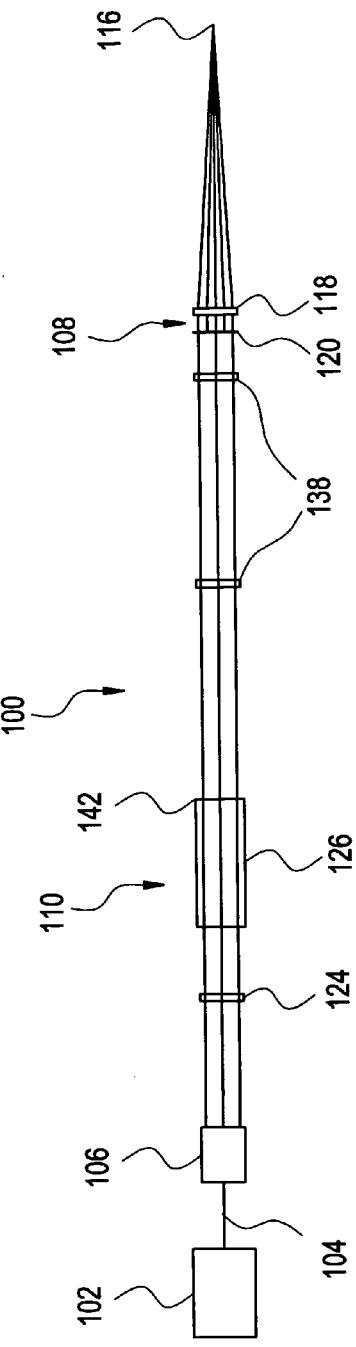

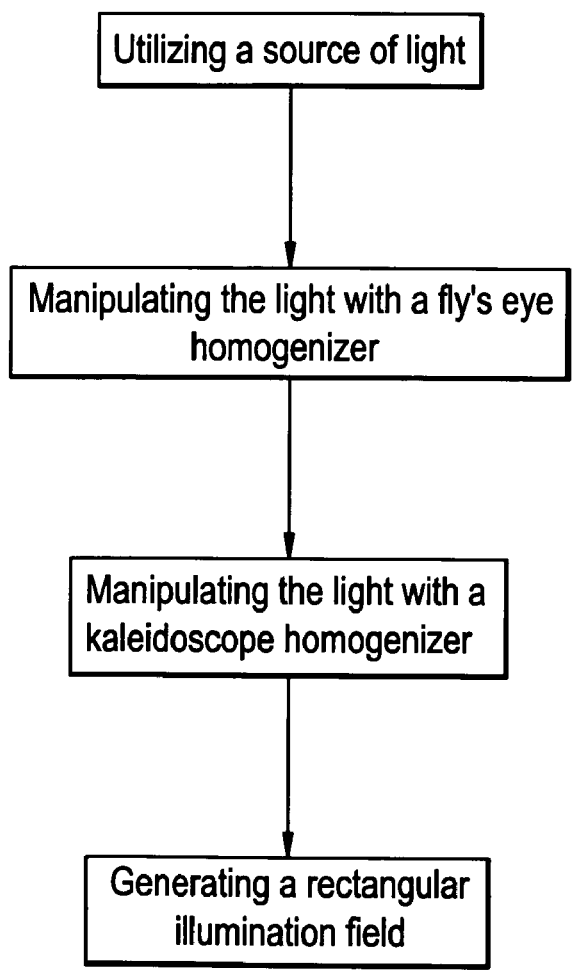

METHODS AND APPARATUSES FOR HOMOGENIZING LIGHT

CLAIM TO PRIORITY

The present invention claims priority under 35 U.S.C. §119(e) of U.S. provisional patent application No. 60/468,511, filed May 7, 2003, the entire disclosure of which is herein incorporated by reference.

FIELD OF THE INVENTION

The present invention is directed to the field of optics. Specifically, the present invention is directed to light homogenizers, and more particularly, to light homogenizers for applications which may require a high aspect ratio fields (e.g., long line light homogenizers). In the context of this invention, the term light is defined as electromagnetic radiation from X-ray to Infrared wavelengths.

BACKGROUND OF THE INVENTION

To perform laser or photon material processing it is often desirable to create a field of uniform irradiation so that the process will produce consistent results within an area of a homogenous optical field. An unrequited goal of current technology is to create a beam homogenizer device capable of transforming a non-uniform light input into a field of homogenized illumination of, for example, rectangular shape with a high aspect ratio. In this context, a high aspect ratio rectangular field is a field having one dimension in the X direction/axis greater than three (3) times the dimension in the (perpendicular) Y direction/axis (or visa versa). High aspect ratio illuminated fields are also known as "long line" fields of illumination.

Long line fields of uniform illumination are useful in many applications such as, for example, photolithography, laser micromachining, laser annealing and other laser or optical surface treatment. Often, a uniformly illuminated mask is imaged using homogenized light onto a target using a projection lens. The mask may be scanned through a uniform field in Coordinated Opposing Motion (COM) to create large patterns in the target plane.

To produce a homogenized field of illumination, beam homogenizers are used. Beam homogenizers are devices that modify an incoming illumination beam such that the uniformity of the output illumination field is largely independent of the illumination uniformity of the raw laser beam (i.e., the beam is homogenized). When non-uniform laser illumination is input into a homogenizer, the beam is angularly or spatially (or both) mixed in a manner that allows a uniform field of illumination to be produced at the output.

There are several prior art methods of fabricating a beam homogenizer. For instance, a multi-lenslet array, known as fly's eye homogenizer, can be used to form a uniform homogenized illumination field. Another method utilizes a multi-segmented reflective or refractive surface to overlap portions of the incident beam to produce a uniform field. Yet another widely used homogenizer technique utilizes the kaleidoscope principle. Holographic devices may also be utilized to create uniformity and control beam divergence.

The prior art devices encounter difficulties creating simple and cost-effective high aspect ratio homogenized fields of illumination. For example, using a simple fly's eye device, to create a 5:1 aspect ratio field homogenized in the x and y directions, the dimensional aspect ratio of the individual fly's eye elements (i.e., ratio of element height to width) must be 25:1 in order to insure field uniformity to approximately ±5%. For 5% uniformity with a 100:1 aspect ratio homogenized field, the optical elements will have an aspect ratio of 500:1. Optical parts with such high aspect ratios are extremely difficult to manufacture. Although such mechanical aspect ratios can be moderated by introducing an anamorphic imaging device between the fly's eye and the mask, such an addition increases complexity to the system.

The nature of the non-uniformity of the raw beam dictates the number of homogenization elements that must be utilized in a given direction. For instance, for a fly's eye array with a 10×10 element array (or 100 elements), each element contributes 1% of the total power to the homogenized field. If the raw input beam possesses a 20% linear non-uniformity, then the aperture of each lenslet will be illuminated uniformly to better than 2% and the homogenized beam will be uniform to better than 2%. For a typical excimer laser application requiring +/−5% homogenization, empirical rules dictate the utilization of at least 6 elements per direction. Thus, for a 1:1 aspect ratio field, at least 36 fly's eye elements are required.

Moreover, the higher the aspect ratio, the more fly's eye homogenizer elements in the lens array are required for good homogenization. For example, to produce an illumination field having an aspect ratio of 5:1, and if the empirical rule for such a system designates 6 elements per direction, then a lens array of 180 elements are required to produce the homogenous optical field.

FIGS. 1A–1D illustrate this problem. For example, FIG. 1A illustrates a fly's-eye array required to create a uniform, 6×6 square field (i.e., aspect ratio of 1:1). If the empirical rule requiring 6 segments per direction is obeyed, the array will contain 36 elements. In FIG. 1B, a 2:1 aspect ratio field has been created. This geometric constraint requires that the number of elements in the vertical direction double and since the horizontal direction requires at least 6 elements for uniformity, 12 are needed for the vertical (i.e 6×12=72 total lenses). In FIG. 1C the problem gets worse—to create a 10:1 aspect ratio field, 60 segments are required in the vertical direction resulting in the total number of elements equaling 6×60=360. FIG. 1D illustrates the problem as it approaches a line field limit. In this case, 3600 elements are required (6×600). It becomes obvious to one of skill in the art that this design becomes prohibitively expensive and impractical to fabricate for this high aspect ratio beam.

Other problems exist for kaleidoscope homogenizers. To produce uniformity in two directions/axes (d1 and d2), a high aspect ratio forces the length of the kaleidoscope homogenizer to become exceedingly long, since the length of the kaleidoscope is proportional to the longest dimension (d1) of the homogenized field. FIGS. 2A through 2C illustrate this problem. For example (FIG. 2A), in a square field kaleidoscope homogenizer, the length of the kaleidoscope controls how many times the light is segmented. For example, for a square kaleidoscope with a given input dimension of, say, 1 cm, and an input cone angle of, say 5 degrees, the light beam may reflect three (3) times and the cone angle will be segmented 7 times per direction. This will typically produce good homogenization. For such a case, the kaleidoscope length will be 34.3 cm. However, for a 2:1 aspect ratio kaleidoscope (FIG. 2B) with the same short dimension of 1 cm, the 3 reflection condition requires the kaleidoscope to become twice as long (68.6 cm) since the long dimension is 2 cm and more path is required to achieve the segmenting. Now, for a 10:1 aspect ratio system (FIG. 2C) with a 1 cm short axis dimension, the length of the kaleidoscope becomes 343 cm. A 100:1 case is worse yet, resulting in a length of 3430 cm (or about 100 feet!). It becomes obvious to one of ordinary skill in the art, that for a high aspect ratio homogenizer, such a kaleidoscope design becomes impractical to implement and extremely cost prohibitive.

Furthermore, to achieve a high aspect ratio field with good laser coupling efficiency, one might expand the laser beam in one direction and compress it in the other. Since the divergence of the beam changes inversely proportionally to the expansion ratio, the divergence will increase beyond the acceptance numerical aperture (NA) of the lens if a great deal of compression is performed. Such homogenization system results in poor light utilization efficiency.

Because of the above noted problems, current long line illumination fields are implemented with only single axis homogenization. In some cases, the long axis would be homogenized while the short axis is left as spatially non-uniform as the original beam spatial intensity distribution in the relevant direction. In other cases, the full length cannot be accommodated, because the long axis of the field is not sufficiently uniform. In these applications, the laser beam is truncated so that only the more uniform section of the beam is used. This truncation lowers efficiency of the beam delivery system.

SUMMARY OF THE INVENTION

Accordingly, embodiments of the present invention utilize the advantages of a fly's-eye array to homogenize one dimension/axis (e.g., a long axis) of an illumination field and the advantage of the kaleidoscope to homogenize another dimension/axis (e.g., a short axis) of the illumination field, to produce a homogenized illumination field in at least two dimensions in a cost-effective and compact device. Moreover, some embodiments of the present invention perform homogenization for two axes simultaneously in the same physical space.

For example, one half of a conventional two-dimensional fly's eye homogenizer (i.e., a one-dimensional fly's eye homogenizer array) is used to homogenize a laser beam in the long direction (d1) of a rectangular field. Two plane/parallel surfaces may be used to form a kaleidoscope-like homogenizer section that is used to homogenize the laser beam in a short direction (d2), for example, of the long line field. The two homogenizers may also shape the beam (i.e., define its dimensions). The directions (d1) and (d2) are typically orthogonal to each other when a rectangular field is being produced. However, (d1) and (d2) can be non-orthogonal when such embodiments are used to homogenize non-rectangular beams (e.g., hexagonal, octagonal, and the like).

The homogenized field produced by some embodiments of the present invention is rarely used as an end result. Typically, the homogenized field is used to illuminate a mask and then is projected through a lens to create an image of the mask at a target (e.g., workpiece). Since all of the optical energy is usually transmitted to the image plane for the condition of homogeneity to be maintained, it becomes important to consider the angular manner in which the light arrives at the homogenized plane as well as the angular manner in which the light leaves the homogenized plane and passes through the projection lens. Accordingly, embodiments of the invention are extremely flexible in this regard since the short axis of the homogenous field and its angular intensity distribution may be completely determined by the kaleidoscope system and the long axis and its associated angular intensity distribution may be independently determined by the fly's eye system. Therefore, sufficient degrees of freedom exist in this invention to optimize the system for homogenizing a field of illumination for projecting through a mask and re-imaged with a projection lens of a reasonable and radially symmetric numerical aperture.

Accordingly, in one aspect of the present invention, an illuminating optical device for forming a field of illumination, may be provided, where the optical device may include a first one-dimensional homogenizer positioned to homogenize a first dimension of the field of illumination and a second one-dimensional homogenizer positioned to homogenize a second dimension of the field of illumination.

In another aspect of the present invention, an illuminating optical device for receiving light flux from a excimer laser and forming a field of illumination may be provided, where the optical device may include a fly's eye homogenizer positioned to homogenize a single first dimension of the field of illumination for producing a first homogenized plane and a kaleidoscope homogenizer positioned to homogenize a second single dimension of the field of illumination for producing a second homogenized plane. The fly's eye homogenizer and the kaleidoscope homogenizer may be provided in a same light path volume and the ratio of the first dimension to the second dimension may be at least 5:1.

In still yet another aspect of the present invention, a method for establishing a field of illumination may be provided, where the method may include homogenizing a first dimension of a field of illumination provided by a light source with a first one-dimensional homogenizer and homogenizing a second dimension of the field of illumination with a second one-dimensional homogenizer.

The field of illumination of the previous embodiment may include a rectangular field of illumination, where a long dimension/axis of the rectangular field of illumination comprises the first dimension and a narrow dimension/axis of rectangular field of illumination comprises the second dimension. Furthermore, in still other aspects of the invention, the method may further include capturing a long line light with a mask and a workpiece.

A particular advantage of some embodiments of the invention is that a workpiece may be scanned with a minimum number of scans (or swathes). Adjacent scans create stitching concerns at the overlap between two adjacent scans which degrades quality of the process. Moreover, some processes (such as silicon annealing, for example) are so sensitive to light dosage, that they may even prohibit any overlap between adjacent scans. So, process quality is enhanced if a part can be processed in the least amount of scans, or even one scan (rather than multiple scans).

These and other features, advantages and objects of some of the embodiments of the present invention will become even more clear with reference to the attached drawings (briefly described below) and detailed description set out below.

BRIEF DESCRIPTION OF THE DRAWINGS

FIG. 4A illustrates a side view of an optical device according to another embodiment of the present invention.

FIG. 4B illustrates a top view of the optical device according to the embodiment of the invention of FIG. 4A.

FIG. 10 is a flow diagram illustrating a process according to an embodiment of the invention for producing homogenized long line light.

DETAILED DESCRIPTION OF THE EMBODIMENTS

Figure 1A:
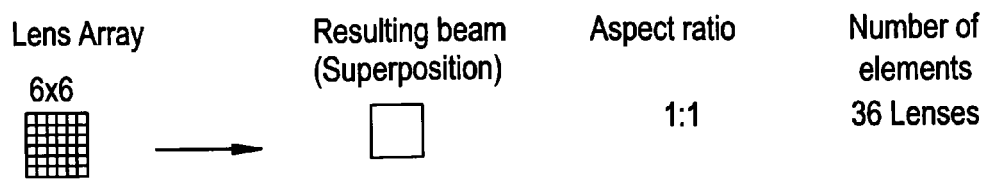
FIGS. 1A–1D illustrates exemplary aspect ratios of fly's eye homogenizers.
Figure 1B:
Figure 1C:
Figure 1D:
Figure 2A:
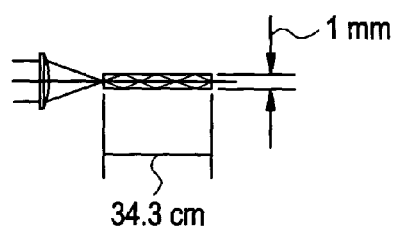
FIGS. 2A–2C illustrates exemplary field sizes of kaleidoscope homogenizers
Figure 2B:
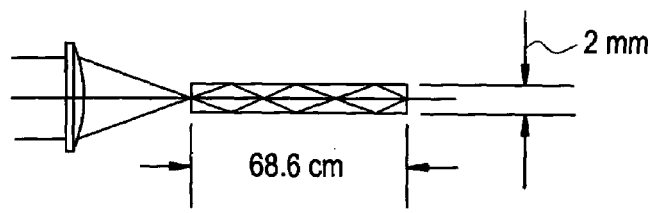
Figure 2C:
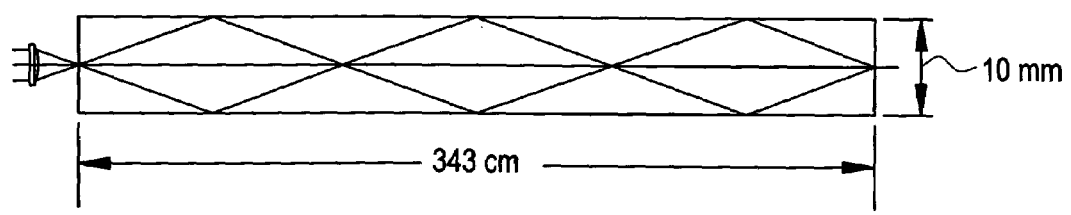

One purpose of the present invention is to generate, for example, a long rectangular laser illumination field homogenized both in a long (wide) direction (d1) and in a short (narrow) direction (d2), wherein (d1):(d2) is at least 5:1 (for example). Accordingly, some embodiments of the invention include an apparatus that synthesizes concepts from kaleidoscope and fly's eye homogenizer techniques to produce such a homogenized field. For example, in some embodiments, a one-dimensional fly's eye homogenizer is used to homogenize the laser beam in the long direction (d1) of the rectangular field and a one-dimensional kaleidoscope homogenizer is used to homogenize the beam in the short direction (d2) of the rectangular field.

To the first order, the aspect ratio for such a rectangular illumination field may be determined in the following manner. The long dimension may equal the distance from the fly's-eye homogenizer focus to mask, multiplied by the result of dividing the width of fly's-eye elements of the homogenizer by the focal length of fly's eye elements. The short dimension width may equal the gap between kaleidoscope opposed reflective surfaces (e.g., mirrors).

In one embodiment, the first homogenizer comprises a n array of cylindrical lenses (fly's eye), which is generally referred to as a homogenizer for Abbe or "critical" illumination. In combination with a condenser lens, the first homogenizer scrambles the beam in the long direction (d1), thereby defining the length of the beam in the long direction (d1) and overlaps multiple images produced by the fly's eye elements at the plane of homogenization. With the fly's eye homogenizer, the near field of the laser beam is conjugate with a mask and with a workpiece and the far field of the laser beam is conjugate with the pupil of a projection lens, for projecting the image of the mask on the workpiece.

The second homogenizer may include two opposed, parallel reflective surfaces (e.g., mirrors) with a small gap in between them, forming a kaleidoscope homogenizer, referred to as a "Koehler" illuminator. While the reflective surfaces can be mirrors, due to the fact the laser beam is incident on the surfaces at grazing angles, many types of materials are effective at achieving high reflectivity. The diverging beam passes between the two surfaces. The high divergence portion of the beam is reflected at least once from the surfaces, and preferably, multiple, predetermined times. The beam emerges from the assembly homogenized in the narrow direction (d2) perpendicular to the two surfaces, with the gap between the two reflective surfaces defining the narrowness (i.e., short dimension) of the homogenized beam. With the kaleidoscope homogenizer, the laser beam is imaged into the pupil of a projection lens. Accordingly, the near field of the laser beam may be conjugate with the pupil of the projection lens and the far field of the laser beam may be conjugate with the mask and with the workpiece.

The fly's eye/kaleidoscope hybrid homogenizer according to the above-embodiment, overcomes the weaknesses of the separate homogenizers. Such embodiment is fairly simple and inexpensive, offering a fairly high optical throughput (high optical efficiency) since substantially all of the laser beam energy is utilized. Often, the homogenized field illuminates a mask, the image of which is relayed to the workpiece via a projection lens. In these cases, one must insure that the divergence of the beam that creates the homogenized field is compatible with the acceptance numerical aperture of the projection lens.

FIGS. 3A–9B illustrate some of the embodiments according to the present invention, while the flow diagram of FIG. 10 summarily illustrates the process accomplished by some of the embodiments.

As shown, a long line homogenizer 100 is arranged to receive light beam 104 from a light source 102 (e.g., a laser). Fly's eye homogenizer arrangement 108 is preferably arranged to homogenize the light beam 104 in at least a first dimension (d1). Kaleidoscope homogenizer 110 is provided preferably in series with the fly's eye arrangement 108. The kaleidoscope homogenizer 110 is arranged to homogenize the light beam 104 in at least a second dimension (d2), wherein the second dimension (d2) is orthogonal to the first dimension (d1). Thus, the "processed" light beam 104 emitted from the long light homogenizer 100 is homogenized in two directions, preferably with a (d1):(d2) ratio of at least 5:1 (for example). The homogenized field may then be eventually projected onto a workpiece 112 using techniques known to those skilled in the art.

For exemplary purposes only, one preferred embodiment will be discussed below with reference to particular dimensions (e.g., focal lengths, divergences, and the like), but is not intended to limit the invention to such specifications. One skilled in the art will appreciate that different size lenses, having different focal lengths and diameters (for example) and alternative arrangements may be used in accordance with the principles of the disclosed invention.

To that end, in one preferred embodiment, a excimer laser (for instance Lambda Physik, LPX 210) may be used for light source 102. Such a laser emits a raw laser beam having a cross-sectional shape is which is quasi-rectangular. For the LPX210, the beam size is approximately 28 mm in a first direction (d1) and 12 mm in the second direction (d2). The beam divergence is approximately +/−2 mrad in the first direction (d1) and +/−0.75 mrad in the second direction (d2).

An anamorphic beam expander 106 (as shown in FIGS. 3A–4B) may be used to expand the light beam 104 in the first direction (d1) to 47.7 mm and may expand the light beam 104 in the second direction (d2) to 40 mm. The anamorphic beam expander typically includes a spherical lens and two cylindrical lenses. The beam divergence of this laser after the beam expander is typically +/−1.4 mrad in the first direction and +/−0.3 mrad in the second direction.

Figure 5:
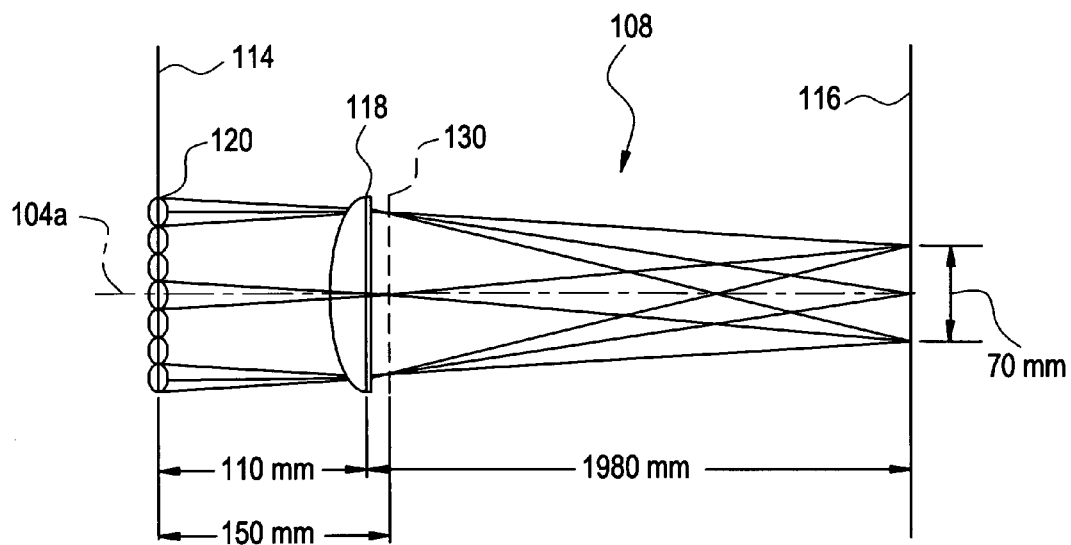
FIG. 5 illustrates a fly's eye homogenizer according to an embodiment of the invention.

After the beam expander, the expanded light (having a central axis 104a) then enters the homogenizer 100. As shown in FIG. 5, the fly's eye homogenizer 108 may be located in an entrance plane 114. The fly's eye homogenizer 108 may include a lens array having, for example, 9 cylindrical lenslets 120, having corresponding axes perpendicular to the direction of the light (e.g., perpendicular to central axis 104a). The cylindrical lenslets 120, in this embodiment, have a focal length of 150 mm, a width of 5.3 mm and a length of 40 mm. The fly's eye homogenizer lens array forms sets of focused lines in a pupil plane 130. A condenser lens 118, maybe located 110 mm away from the lenslets 120 and may also have a focal length of 2 meters and is perpendicular to the direction of the beam. The homogenized plane may therefore be approximately 2 meters downstream from the condenser lens 118 in an exit plane 116. In the exit plane 116, the beam is homogenized in the first direction (d1), which is an optical result of transmitting the light beam through the lenslets 120 and the condenser lens 118. In the above example, the resulting homogenized beam in exit plane 116 is 70 mm wide and has a divergence of +/−12 mrad in the first direction (d1).

Figure 6:
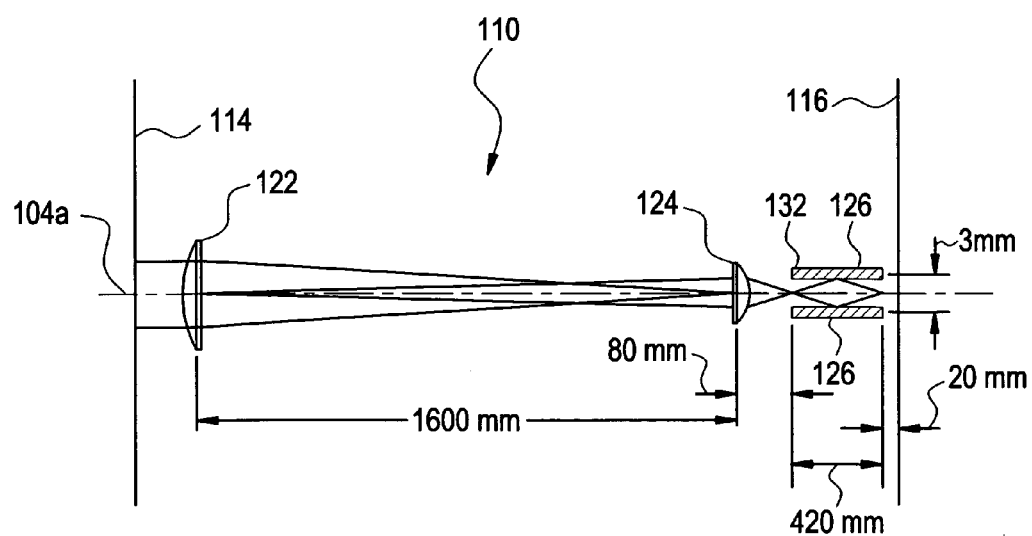
FIG. 6 illustrates a kaleidoscope homogenizer according to an embodiment of the invention.

The beam is homogenized in the second direction (d2), orthogonal to the beam direction and the first direction (d1), with a kaleidoscope homogenizer 110, as shown in FIG. 6. A focusing lens 124 re-images the laser beam 104 distribution near an entrance 132 to the kaleidoscope homogenizer 110. The focusing lens 124 may be a cylindrical lens with a focal length of 80 mm and a demagnification factor of 20:1. The beam 104 size at the entrance 132 of the kaleidoscope homogenizer 110 may be approximately 2 mm and its divergence is +/−6 mrad in the second direction (d2). A cylindrical field lens 122, having a focal length of approximately 1600 mm, may be used near the entrance plane 114 to collect all the beam 104 rays in the second direction (d2) into the entrance aperture of the focusing lens 124.

The kaleidoscope homogenizer 110 may include 2 parallel reflective surfaces 126, preferably mirrors, parallel to the beam 104 direction and to the first direction (d1). In the presently described embodiment, the gap between the two parallel surfaces 126 may be approximately 3 mm, the mirror length may be 420 mm and the mirror width may be 70 mm. The exit plane 116 may be close to the exit 142 of the kaleidoscope homogenizer 110. The beam 104 size at the exit plane 116 is typically the same as the gap between the surfaces 126 (3 mm) and the divergence is typically the same as at the entrance 132 of the kaleidoscope homogenizer 110 (+/−6 mrad). Alternatively, the kaleidoscope homogenizer may comprise a rectangular slab of polished glass, with light being input into one end of the slab and internal reflection keeping the light contained in the slab (as it is scrambled along the length). Lenses 138 can be used to re-image the kaleidoscope exit 142 to the exit plane 116.

Figure 7:
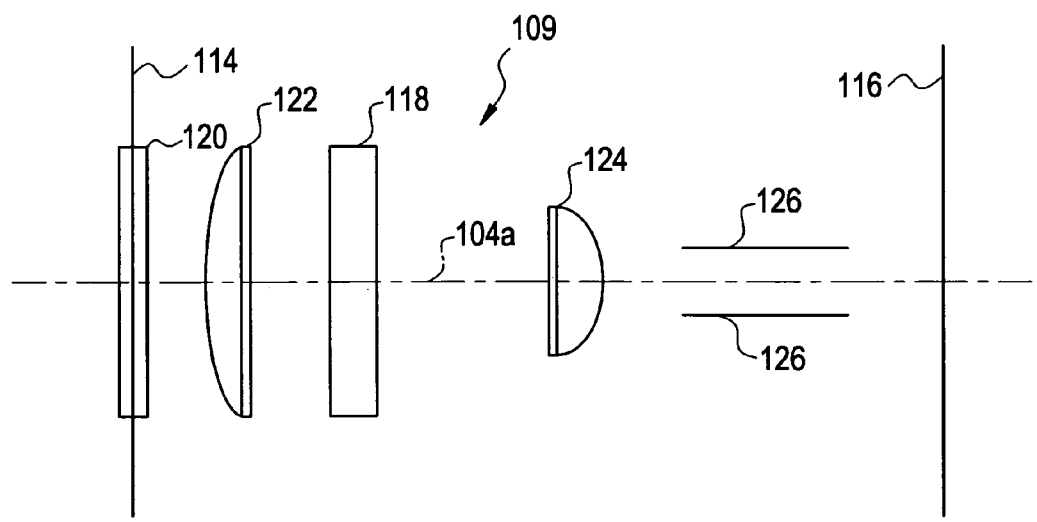
FIG. 7 illustrates the arrangement of overlaying portions of the homogenizers shown in FIGS. 5 and 6 according to an embodiment of the invention.
Figure 8:
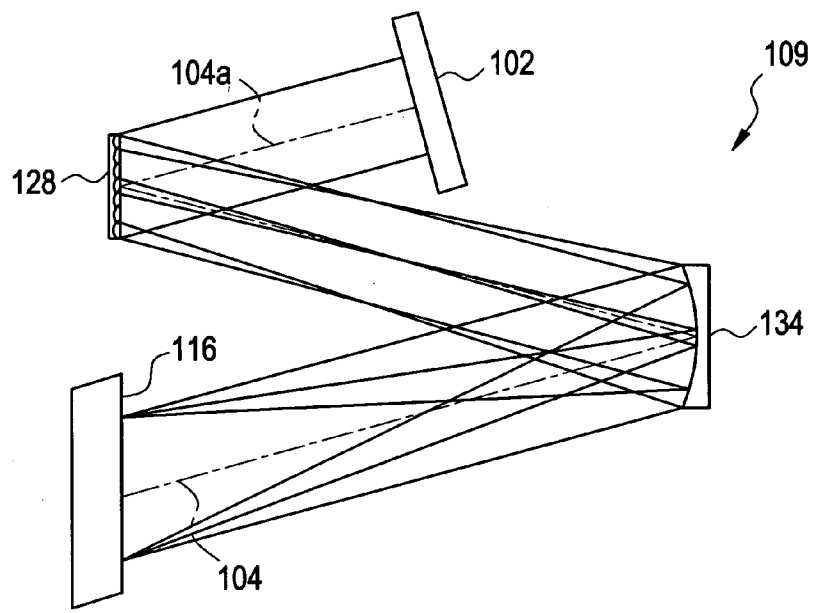
FIG. 8 illustrates elements of a fly's eye homogenizer according to an embodiment of the present invention.

Thus, the beam 104 is homogenized in the exit plane 116 by the fly's eye homogenizer 108 in the first direction (d1) and by the kaleidoscope homogenizer 110 in the second direction (d2). FIG. 7 shows one embodiment of the interrelationship of the elements of the fly's eye homogenizer 108 and the kaleidoscope homogenizer 110, from the same perspective as FIG. 6. It can be seen that by using different lenses (i.e. 118, 120, etc.) and/or having different focal lengths, the interrelationship of the elements of the fly's eye and kaleidoscope homogenizers 108, 110, may be altered. In preferred embodiments, the fly's eye homogenizer may be located either before or within the kaleidoscope homogenizer, for example.

Figure 9A:
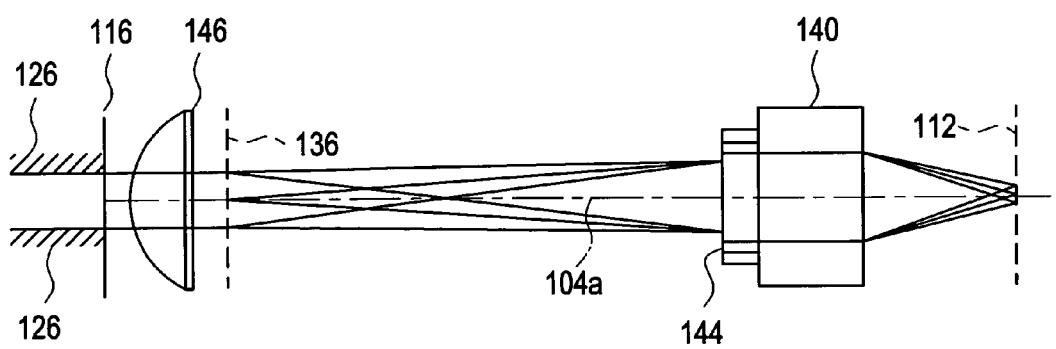
FIG. 9A illustrates the imaging of a mask pattern onto a workpiece from a long line homogenizer according to an embodiment of the present invention.

As shown in FIG. 9A, a mask 136 may be located near the exit plane 116, and a projection lens 140 may be used after the mask 136 to project the image of the pattern generated by the mask 136 onto the workpiece 112 with a given demagnification ratio. Those skilled in the art will recognize how such projection lenses are implemented. For example, in the presently described embodiment, with a 4× demagnification ratio, the illuminated beam size on the workpiece is 17.5 mm in the first direction (d1) and 0.75 mm in the second direction (d2).

Figure 9B:
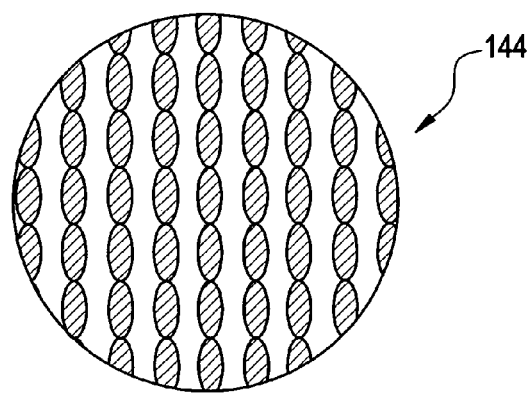
FIG. 9B illustrates a view of the illumination distribution at a pupil of a projection lens plane according to an embodiment of the present invention.

A field lens 146 may be positioned close to the mask 136 in order to bring all the beam 104 rays emerging from the homogenizer exit plane 116 into the pupil 144 of the projection lens 140. The plane of the pupil 144 of the projection lens 140 then contains, in the above described embodiment, 9 lines of light (light 104) perpendicular to the first direction (d1) (FIG. 9B). These narrow lines correspond to the 9 lenslets 120 of the fly's eye homogenizer 108. Although the lines may not be uniformly illuminated, the lines will typically include a series of zones, each corresponding to a multiple reflection on the facets of the kaleidoscope reflective surfaces 126. For example, the center zone corresponds to 0 reflection, the first zone corresponds to 1 reflection, the second zone to 2 reflections, and so on.

Those skilled in the art will also recognize that the lens array of the fly's eye homogenizer in the above-embodiment may be substituted with different optical arrangements that essentially offer the same results. For instance, an array of cylindrical mirrors 128 can be used instead of the cylindrical lens array to form a fly's eye homogenizer using a reflective mode 109 instead of a transmissive mode (FIG. 8. where a reflective condenser mirror 134 is utilized). A lens array or mirror array can be also fabricated either onto one single substrate or it can be fabricated as multi-elements that are butted together to form a lens array or a mirror array. The fly's eye homogenizer can also be fabricated using diffractive optical techniques or a combination of diffractive, refractive and reflective optic techniques. All these techniques may be used to create essentially a one-dimensional fly's eye homogenizer according to the present invention. Ultimately, this invention requires light to travel from a light source to a fly's eye homogenizer and a kaleidoscope homogenizer, ending up at a workpiece, regardless of whether these elements are reflective or transmissive and regardless of the number of additional lenses involved.

Although embodiments of the present invention have been described with reference to a long line illumination device for homogenizing two dimensions/axes, embodiments of the invention may also be used to homogenize multiple (n) dimensions. The utility of homogenizing additional directions depends on the nature of the non-uniformity of the input beam. (See, for example, U.S. Pat. No. 4,918,583, the entire reference herein incorporated by reference, with particular reference to FIG. 9, column 9, line 64).

Moreover, in still other embodiments of the invention, a near field distribution of a laser may be conjugate with the homogenized plane in both axes. Including this case, there are four (4) further embodiments according to the functionality of the present invention:

a. the source near field is conjugate to the fly's-eye input, the kaleidoscope output, and to the target (e.g., Abbe illumination fly's-eye and Abbe illumination kaleidoscope);

b. the source near field is conjugate to the fly's-eye output and to the projection lens, and conjugate to the kaleidoscope output and the target (i.e., Koehler illumination fly eye fly's-eye and Abbe illumination kaleidoscope);

c. the source near field is conjugate to the fly's-eye output and to the projection lens pupil, and conjugate to the kaleidoscope output and the target (i.e., Koehler illumination fly eye fly's-eye and Koehler illumination kaleidoscope); and d. the source near field is conjugate to the fly's-eye input and to the target, and is also conjugate to the kaleidoscope output and the target (i.e., Abbe illumination fly eye fly's-eye and Koehler illumination kaleidoscope).

Figure 3A:
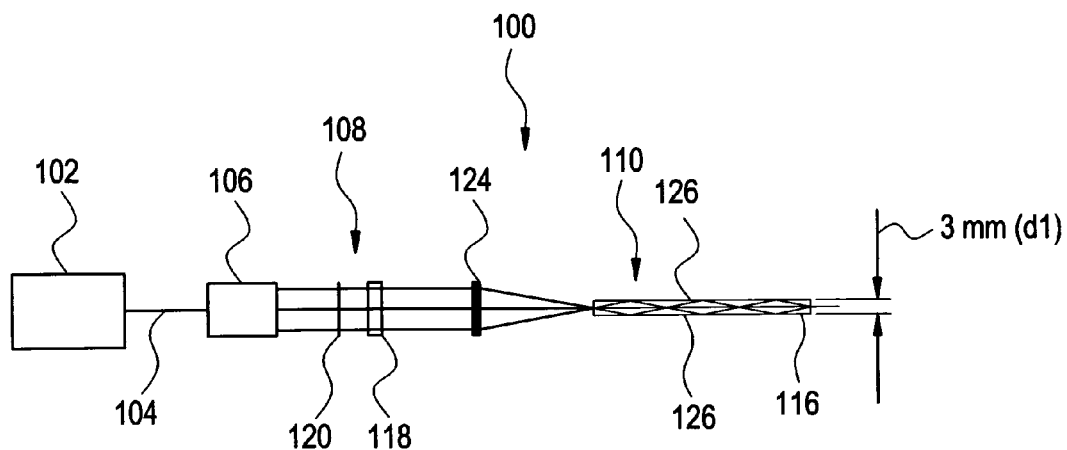
FIG. 3A illustrates a side view of an optical device according to one embodiment of the present invention.
Figure 3B:
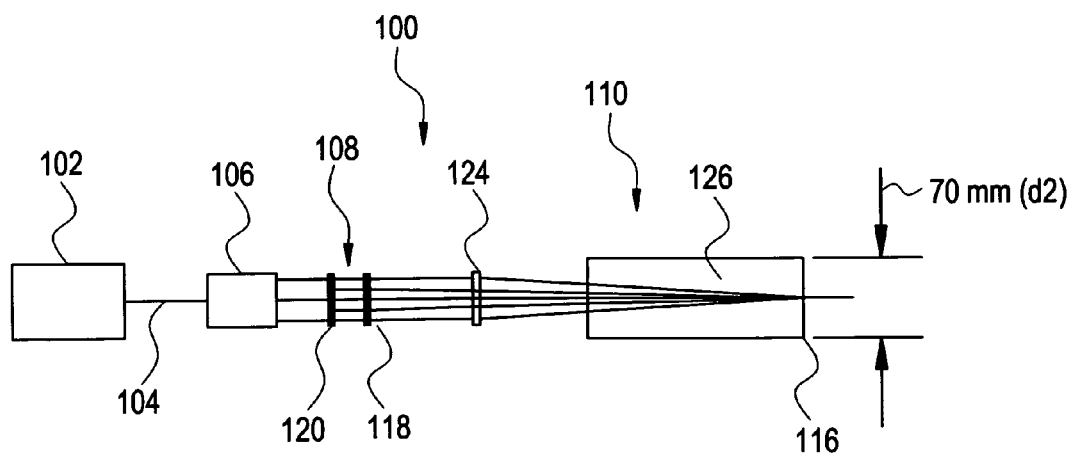
FIG. 3B illustrates a top view of the optical device according to the embodiment of the invention of FIG. 3A.

Although in one preferred embodiment of the invention the homogenized plane produced by the fly's-eye homogenizer coincides with the homogenized plane produced by the kaleidoscope part of the homogenizer, as shown in FIGS. 3A and 3B, this does not need to be necessarily the case. One homogenized plane may be relayed into another homogenized plane with the use of optical elements such as lenses or mirrors as shown in FIGS. 4A and 4B. In particular embodiments, the only requirements is that the homogenized plane produced in one direction by the fly's-eye portion is optically conjugated to the homogenized plane produced in the other direction by the kaleidoscope part of the homogenizer.

Having now described a few embodiments of the invention, it should be apparent to those skilled in the art that the foregoing is merely illustrative and not limiting, and it should be understood that numerous changes in creating and operating such systems and methods may be introduced without departing from the true spirit of the invention as defined in the appended claims.

What is claimed is:

1. An optical device for establishing an output field of illumination homogenized in two different dimensions from input illumination, the optical device composing:
    a light path volume comprising an entrance plane and an exit plane;
    a first one-dimensional homogenizer positioned within the light path volume and producing a homogenized field of input illumination in a first dimension at the exit plane; and
    a second one-dimensional homogenizer positioned within the light path volume, and producing a homogenized field of input illumination in a second dimension different from the first dimension at the exit plane, wherein one or more components of the second one-dimensional homogenizer are positioned among components of the first one-dimensional homogenizer.

2. The optical device according to claim 1, further comprising a light source for providing the input illumination.

3. The optical device according to claim 1, wherein the first homogenizer comprises a fly's eye homogenizer and the second homogenizer comprises a kaleidoscope homogenizer.

4. The optical device according to claim 3, wherein the fly's eye homogenizer comprises a first lens having a plurality of abutting quasi-cylindrical lenses and a condensing lens in series with the first lens.

5. The optical device according to claim 3, wherein the kaleidoscope homogenizer comprises at least one pair of flat reflective surfaces parallel to each other.

6. The optical device according to claim 5, wherein the pair of reflective surfaces are provided in an opposed arrangement.

7. The optical device according to claim 1, wherein the output field of illumination comprises a rectangular field of illumination.

8. The optical device according to claim 7, wherein the first dimension comprises a short dimension/axis of the rectangular field and wherein the second dimension comprises a long dimension/axis of the rectangular field.

9. The optical device according to claim 1, wherein the first dimension is orthogonal to the second dimension.

10. The optical device according to claim 1, wherein the ratio of the first dimension to the second dimension is at least 5:1.

11. The optical device according to claim 1, further comprising a light source for providing the input illumination, wherein a near field of the input illumination produced by the light source is conjugate with a pupil of an projection lens for the second homogenizer, and wherein a far field of the input illumination produced by the light source is conjugate with at least one of a mask and a workpiece.

12. The optical device according to claim 1, further comprising a light source for providing the input illumination, wherein a near field of the input illumination produced by the light source is conjugate with at least one of a mask and a workpiece and a far field of the input illumination produced by the light source is conjugate with a pupil of a projection lens for the first homogenizer.

13. The optical device according to claim 1, further comprising a light source for providing the input illumination, wherein a near field of the input illumination produced by the light source is conjugate with at least one of a mask, a workpiece and a pupil of an objective lens for the second homogenizer, and wherein a far field of the input illumination produced by the light source is conjugate with at least one of a mask, a workpiece and a pupil of a projection lens for the first homogenizer.

14. A method for establishing an output field of illumination homogenized in two different dimensions from input illumination comprising:
    providing a light path volume comprising an entrance plane and an exit plane;
    providing a first one-dimensional homogenizer positioned within the light path volume and producing a homogenized field of input illumination in a first dimension at the exit plane;
    providing a second one-dimensional homogenizer positioned within the light path volume, and producing a homogenized field of input illumination in a second dimension different from the first dimension at the exit plane, wherein one or more components of the second one-dimensional homogenizer are positioned among components of the first one-dimensional homogenizer;
    homogenizing input illumination in the first dimension with the first one-dimensional homogenizer to produce a homogenized field of input illumination in a first dimension at the exit plane; and
    homogenizing input illumination in a second dimension different from the first dimension with the second one-dimensional homogenizer producing a homogenized field of input illumination in a second dimension different from the first dimension at the exit plane.

15. An optical device for establishing an output field of illumination homogenized in two different dimensions from input illumination, the optical device comprising:
    a light path volume comprising an entrance plane and an exit plane;
    a fly's eye homogenizer positioned within the light path volume and producing a homogenized field of input illumination in a first dimension at the exit plane; and
    a kaleidoscope homogenizer positioned within the light path volume and producing a homogenized field of input illumination in a second dimension different from the first dimension at the exit plane, wherein
        one or more components of either homogenizer are positioned among components of the remaining homogenizer.

* * * * *